(12) United States Patent
Zhou et al.

(10) Patent No.: US 7,527,900 B2
(45) Date of Patent: May 5, 2009

(54) RETICLE AND OPTICAL PROXIMITY CORRECTION METHOD

(75) Inventors: Wen-Zhan Zhou, Singapore (SG); Jin Yu, Singapore (SG); Kai-Hung Alex See, Singapore (SG)

(73) Assignee: United Microelectronics Corp., Hsin-Chu (TW)

( * ) Notice: Subject to any disclaimer, the term of this patent is extended or adjusted under 35 U.S.C. 154(b) by 510 days.

(21) Appl. No.: 11/164,127

(22) Filed: Nov. 10, 2005

(65) Prior Publication Data
US 2007/0105023 A1    May 10, 2007

(51) Int. Cl.
G03F 1/00    (2006.01)
(52) U.S. Cl. .............................. 430/5; 716/19
(58) Field of Classification Search .............. 430/5; 359/292; 716/19
See application file for complete search history.

(56) References Cited

U.S. PATENT DOCUMENTS 6,214,494 B1 * 4/2001 Bula et al. ..................... 430/5
6,767,675 B2 * 7/2004 Koike ........................... 430/5
2003/0152873 A1 * 8/2003 Tainaka et al. ............... 430/313
2005/0287445 A1 * 12/2005 Liu ................................ 430/5

OTHER PUBLICATIONS

Tolliver, D.L. (1988). Handbook of Contamination Control in Microelectronics—Principles, Applications and Technology. William Andrew Publishing/Noyes. Chapter 12, p. 407.*

* cited by examiner

Primary Examiner—Mark F Huff
Assistant Examiner—Stewart A Fraser
(74) Attorney, Agent, or Firm—Winston Hsu (57) ABSTRACT

An OPC method includes providing a primary mask having a primary pattern, forming an assist mask having a correction pattern substantially complementary to the primary pattern, and forming a reticle by overlapping the primary mask and the assist mask. The light transmittance of the correction pattern is adjustable so as to equalize the light intensity distribution of the primary mask.

16 Claims, 9 Drawing Sheets

RETICLE AND OPTICAL PROXIMITY CORRECTION METHOD

BACKGROUND OF THE INVENTION

1. Field of the Invention

The present invention relates to a reticle and an optical proximity correction (OPC) method, and more particularly, to an OPC method that uses a reticle incorporating an assist mask with a primary mask.

2. Description of the Prior Art

In semiconductor fabrications, quality of lithography process is critical to yield of semiconductor processes. In a lithography process, integrated circuit layout pattern disposed on a reticle (photo mask) is transferred into a photoresist layer coated on a material to be patterned. The patterned photoresist layer is then used as a hard mask to etch the material so as to form the integrated circuit layout in the material. By repeatedly patterning different material layers on a semiconductor wafer, integrated circuit is therefore fabricated.

In a lithography process, proximity effect has been observed. The proximity effect can be divided into two groups: optical proximity effect which depends on optical system behavior and non-optical proximity effect which results from some factors such as photoresist acid diffusion, flare, micro-loading effect, etc. In order to overcome the proximity effect, various OPC models have been proposed.

Figure 1:
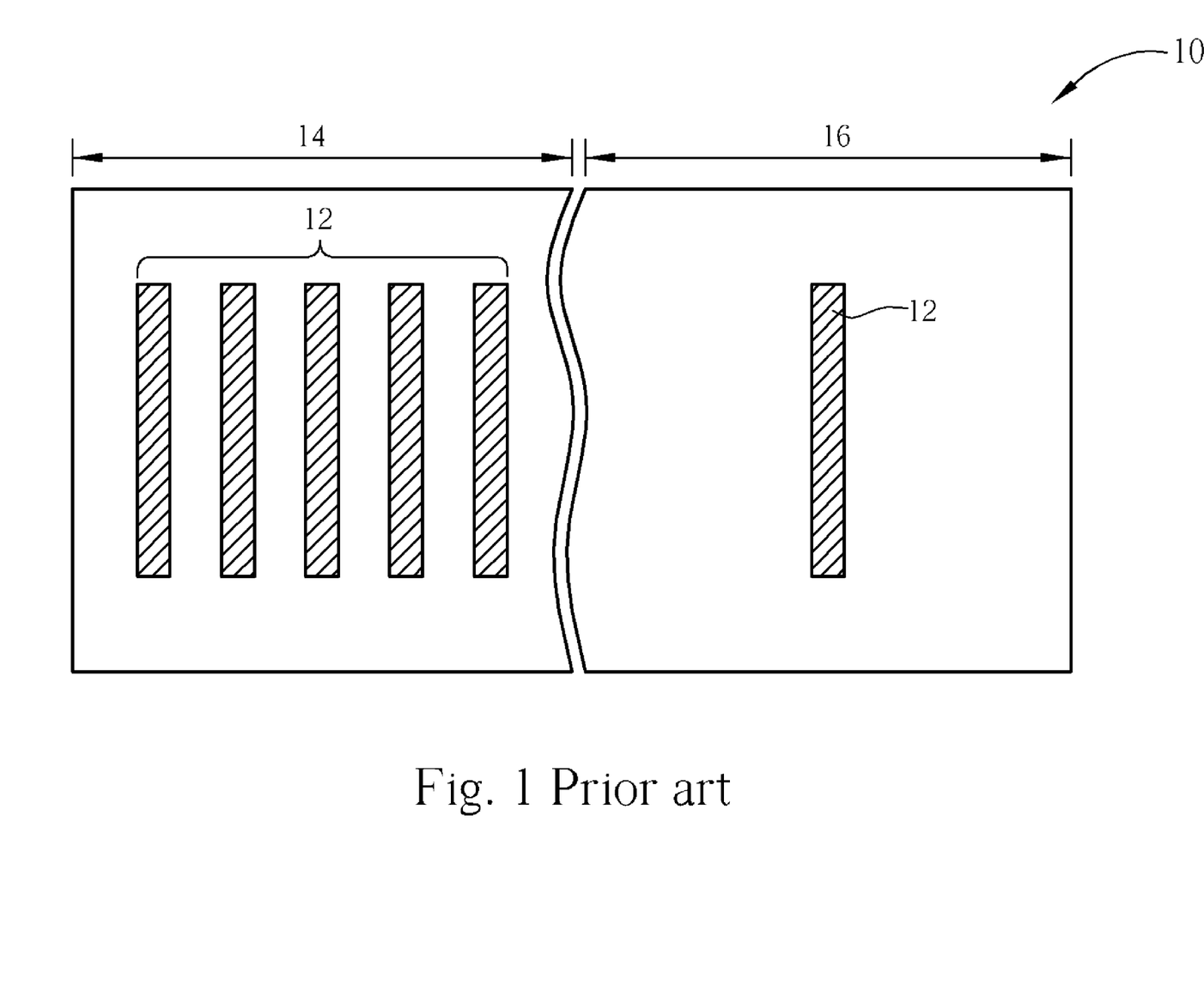
FIG. 1 and FIG. 2 are schematic diagrams illustrating a conventional OPC method.
Figure 2:
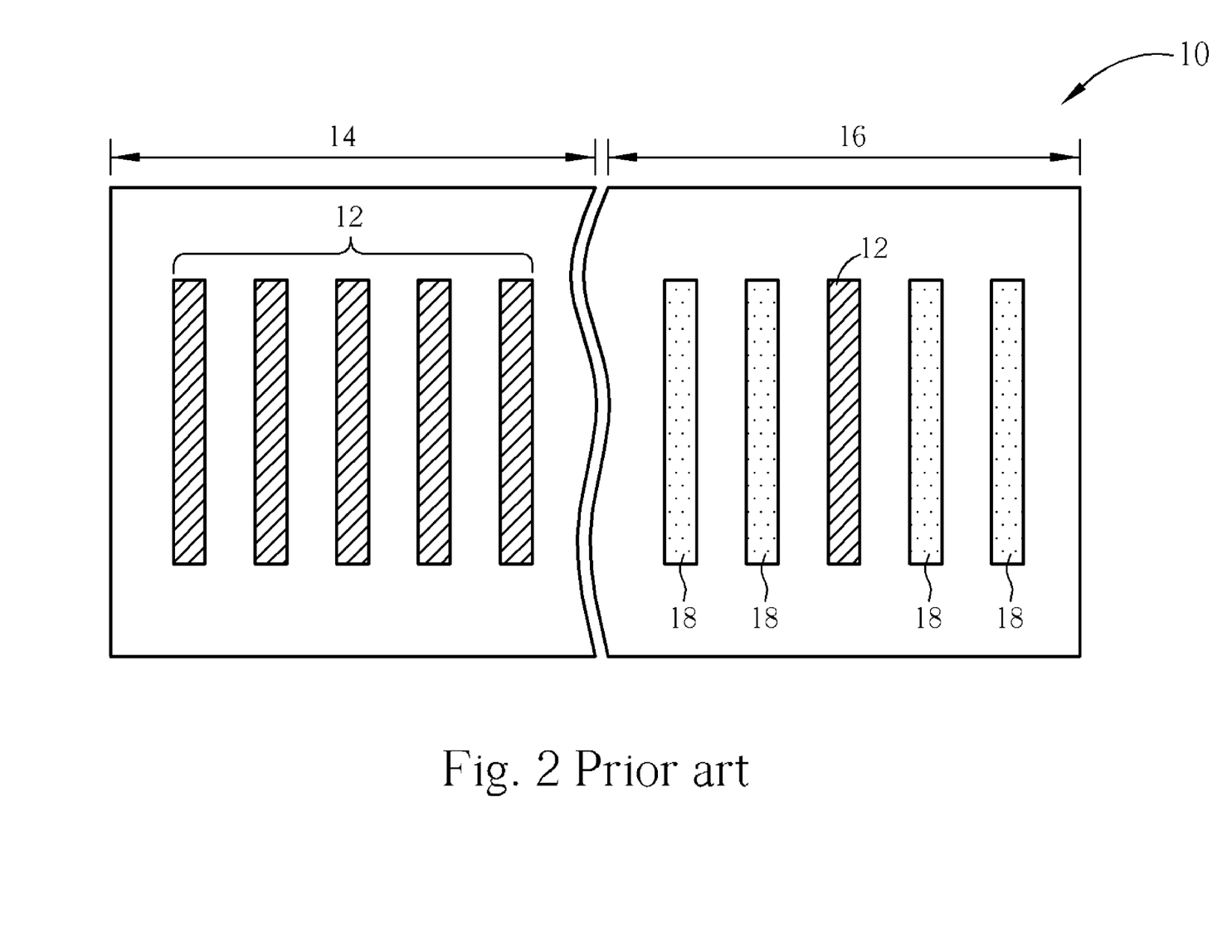

With reference to FIG. 1 and FIG. 2, FIG. 1 and FIG. 2 are schematic diagrams illustrating a conventional OPC method. As shown in FIG. 1, a reticle 10 has a pattern 12 to be transferred disposed thereon. The pattern 12 of the reticle 10 is identical to an integrated circuit layout to be transferred. Normally, the reticle 10 includes a dense region 14 in which the pattern 12 is arranged more densely and an isolated region 16 in which the pattern 12 is arranged less densely. This uneven distribution causes an uneven light transmittance in the exposure process, and therefore generates micro-loading effect. The micro-loading effect leads to pattern deviations. Specifically, the photoresist pattern may be different from the pattern 12 on the reticle 10. As shown in FIG. 2, the prior art OPC method forms a dummy pattern 18 on the reticle 10 to reduce the micro-loading effect. The dummy pattern 18 has a phase difference of 180 degrees from the pattern 12 so that the dummy pattern 18 is not transferred into the material to be patterned. However, the dummy pattern 18 is also formed in the reticle 10. This means the dummy pattern 18 cannot be changed after the reticle 10 is made. As long as any parameter of the lithography process needs to be changed or the dummy pattern 18 needs to be modified to optimize the quality of lithography process, the reticle 10 has to be redesigned. Since the manufacturing cost of a reticle is high, the conventional OPC method dramatically increases the cost of lithography process.

SUMMARY OF THE INVENTION

It is therefore an object of the claimed invention to provide a reticle and an OPC method to reduce the cost and to improve the flexibility of lithography process.

According to the claimed invention, a reticle is provided. The reticle includes a primary mask having a primary pattern, and an assist mask having a correction pattern substantially complementary to the primary pattern.

According to the claimed invention, an optical proximity correction (OPC) method is provided. The OPC method includes:

providing a primary mask having a primary pattern;
forming an assist mask having a correction pattern substantially complementary to the primary pattern; and
forming a reticle by overlapping the primary mask and the assist mask;
wherein a light transmittance of the correction pattern is adjustable so as to equalize a light intensity distribution of the primary mask.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
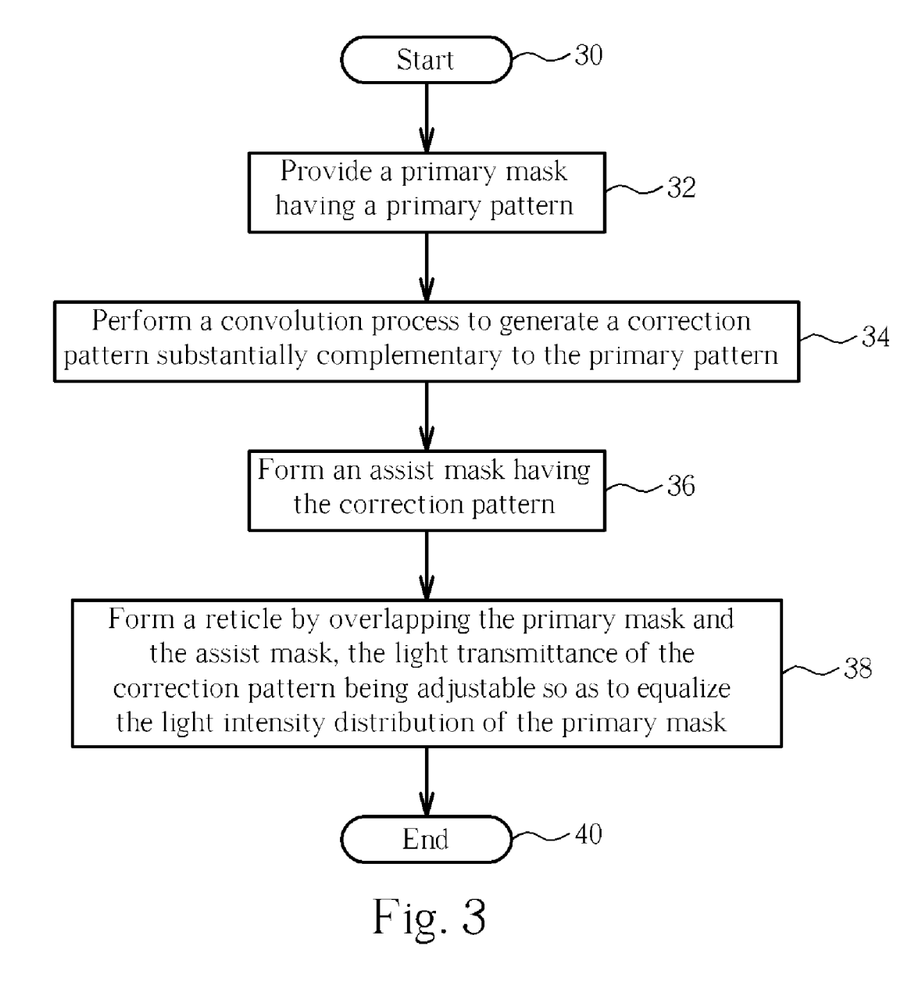
FIG. 3 is a flow chart of an OPC method of the present invention.

With reference to FIG. 3, FIG. 3 is a flow chart of an OPC method of the present invention. As shown in FIG. 3, the OPC method of the present invention includes the steps of:

Step 30: Start;
Step 32: Provide a primary mask having a primary pattern;
Step 34: Perform a convolution process to generate a correction pattern substantially complementary to the primary pattern;
Step 36: Form an assist mask having the correction pattern;
Step 38: Form a reticle by overlapping the primary mask and the assist mask, the light transmittance of the correction pattern being adjustable so as to equalize the light intensity distribution of the primary mask;
Step 40: End.

It can be seen that the OPC method of the present invention combines an assist mask with a primary mask to form a reticle. The primary mask has a primary pattern disposed thereon which is the circuit layout to be transferred into a photoresist layer, while the assist mask has a correction pattern disposed thereon to adjust the light transmittance so that the light intensity distribution of the reticle is substantially equalized.

Figure 4:
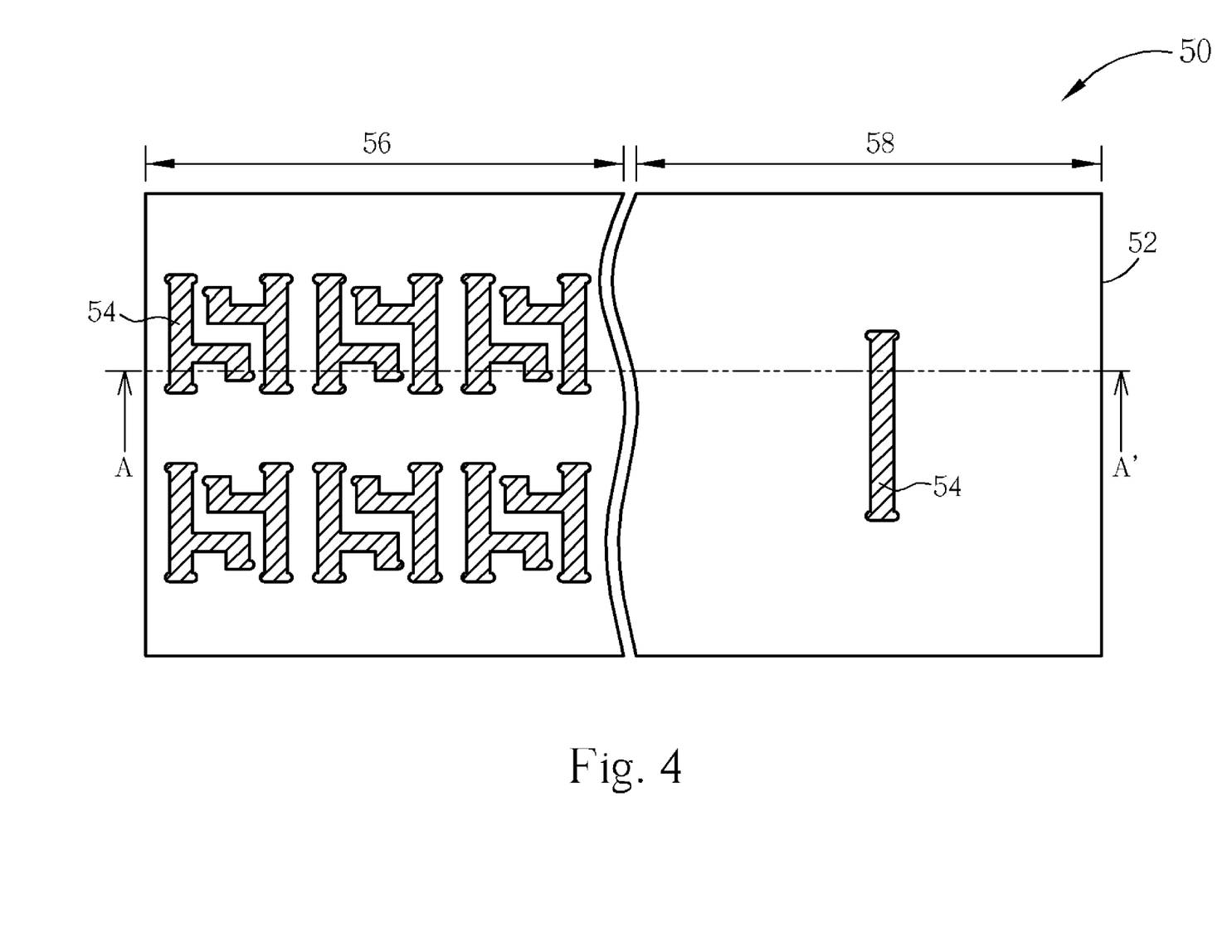
FIGS. 4-6 are schematic diagrams illustrating an OPC method in accordance with a preferred embodiment.
Figure 5:
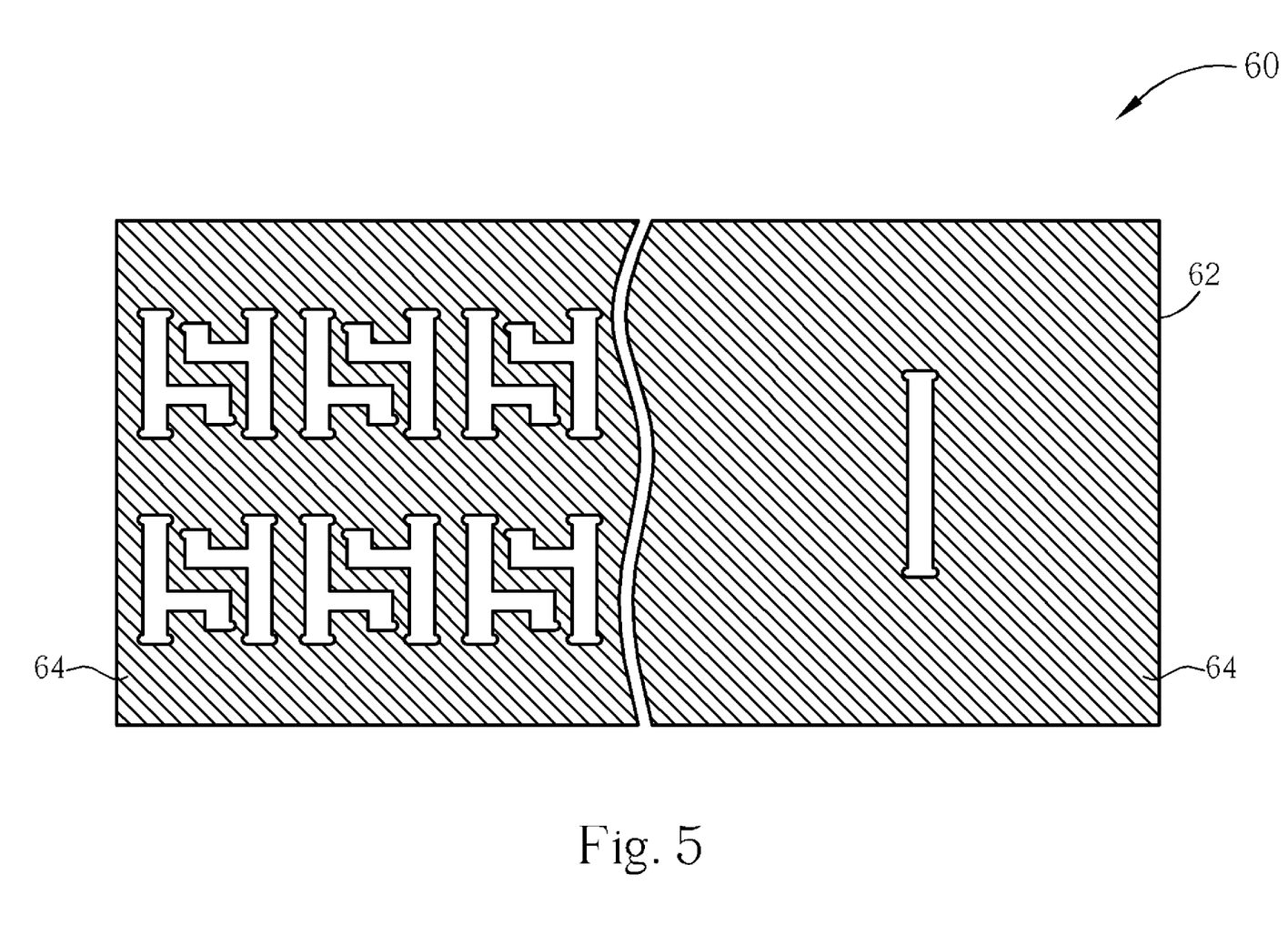
Figure 6:
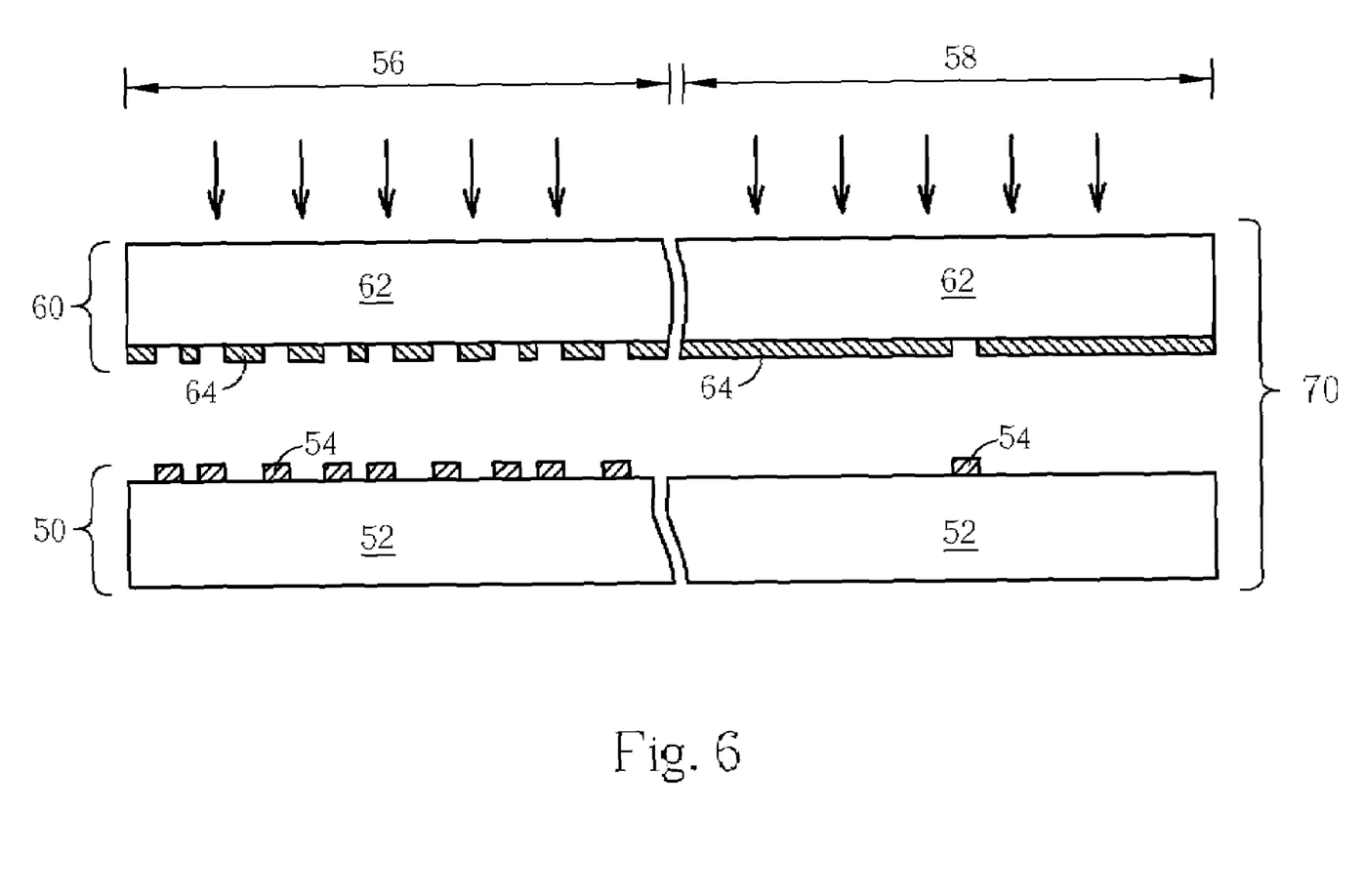

With reference to FIGS. 4-6, FIGS. 4-6 are schematic diagrams illustrating an OPC method in accordance with a preferred embodiment. As shown in FIG. 4, a primary mask 50 is provided. The primary mask 50 includes a mask body 52 and a primary pattern 54 disposed thereon. The primary mask 50 can be divided into a dense region 56 in which the primary pattern 54 is arranged more densely and an isolated region 58 in which the primary pattern 54 is arranged less densely.

As shown in FIG. 5, a convolution process, e.g. a gaussian kernal process or a double gaussian kernel process, is implemented in accordance with the layout of the primary pattern 54 to generate a layout of a correction pattern substantially complementary to the primary pattern 54. It is appreciated that the shape of the correction pattern may be modified, for example slightly trimming the edge of the correction pattern, so as to improve proximity correction effect. Then, an assist mask 60 is provided. The assist mask 60 includes a mask body 62 and a correction pattern 64 disposed thereon.

As shown in FIG. 6 that schematically illustrates a cross-sectional view along the line AA' in FIG. 4, the assist mask 60 is combined with the primary mask 50 by overlapping the two masks together so as to form a reticle 70. Since the correction pattern 64 and the primary pattern 54 are not disposed in the same level, the correction pattern 64 is therefore able to adjust the light transmittance in the exposure process without forming an image in a photoresist layer. By virtue of the correction pattern 64, the light intensity distribution of the reticle 70 is equalized. It is appreciated that the relative position of the assist mask 60 and the primary mask 50 is not limited, i.e. the assist mask 60 may be either below or above the primary mask 50.

Figure 9:
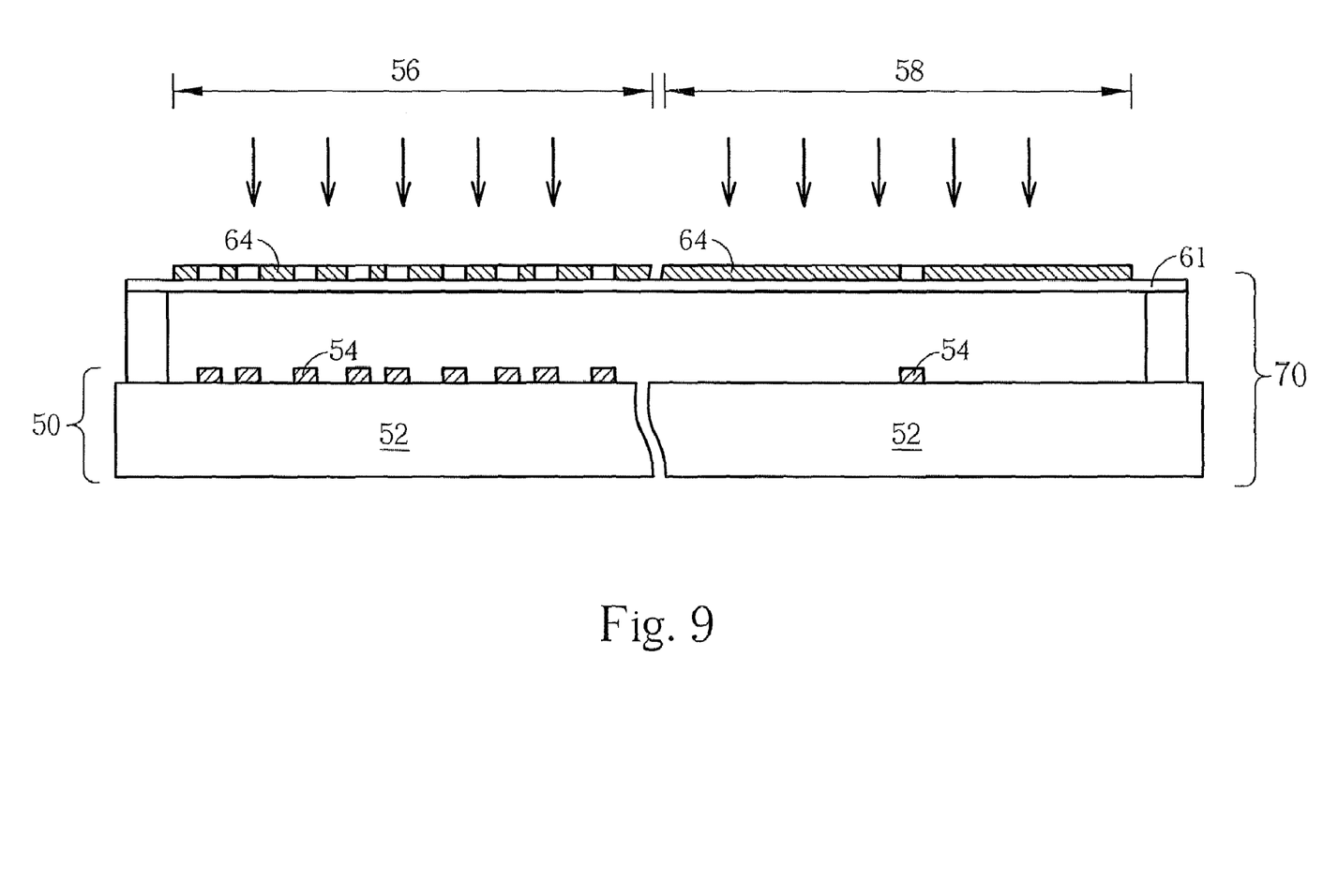
FIG. 9 is a schematic diagram illustrating a reticle using a pellicle as an assist mask according to another embodiment.

One of the goals of the present invention is to propose a low-cost OPC method with flexibility, so the assist mask 60 should be very cheap compared with the primary mask 50 and the light transmittance of the correction pattern 64 should be adjustable. For example, the correction pattern 64 of the present invention can be a halftone material such as molybdenum silicide (MoSi). In such a case, the assist mask 60 is very cheap, and the light transmittance of halftone material can be easily adjusted by changing the thickness of the halftone material. In addition, the assist mask of the present invention may also be replaced by a pellicle 61 mounted on the primary mask 50, and the correction pattern 64 may be a dye material e.g. an organic dye material as shown in FIG. 9. In such a case, the light transmittance of the correction pattern 64 can be easily adjusted by changing the concentration of the dye material.

Figure 7:
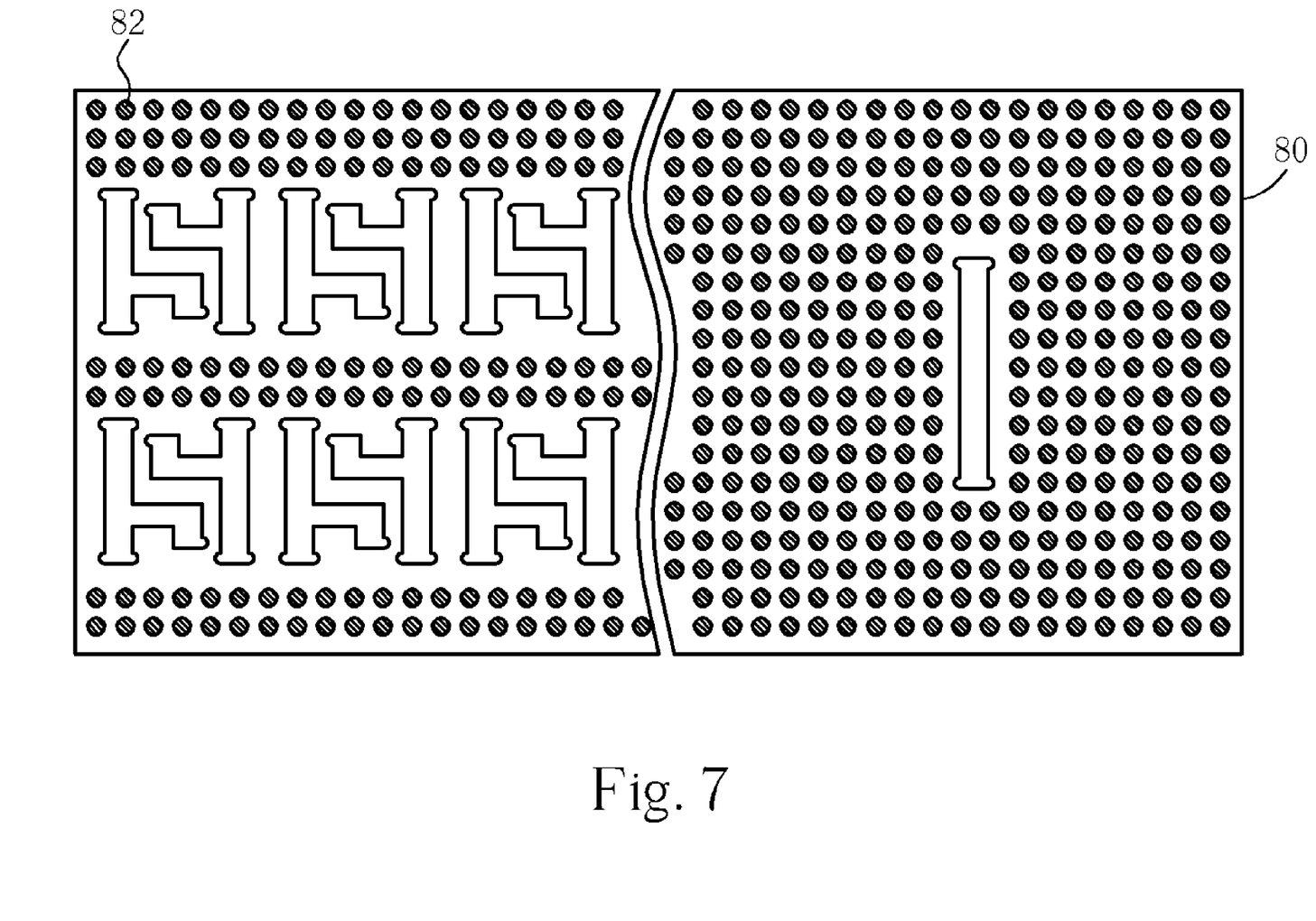
FIG. 7 is a schematic diagram illustrating a correction pattern in accordance with another embodiment.

With reference to FIG. 7, FIG. 7 is a schematic diagram illustrating a correction pattern in accordance with another embodiment. As shown in FIG. 7, the correction pattern 80 may be any suitable light-shielding material, and has a dot pattern 82. The dot pattern 82 is non-transparent, and the light transmittance can be easily adjusted by tuning the density of the dot pattern 82. It is appreciated that the dot pattern 82 can be any shapes such as a small circle, triangle, rectangle, etc.

Figure 8:
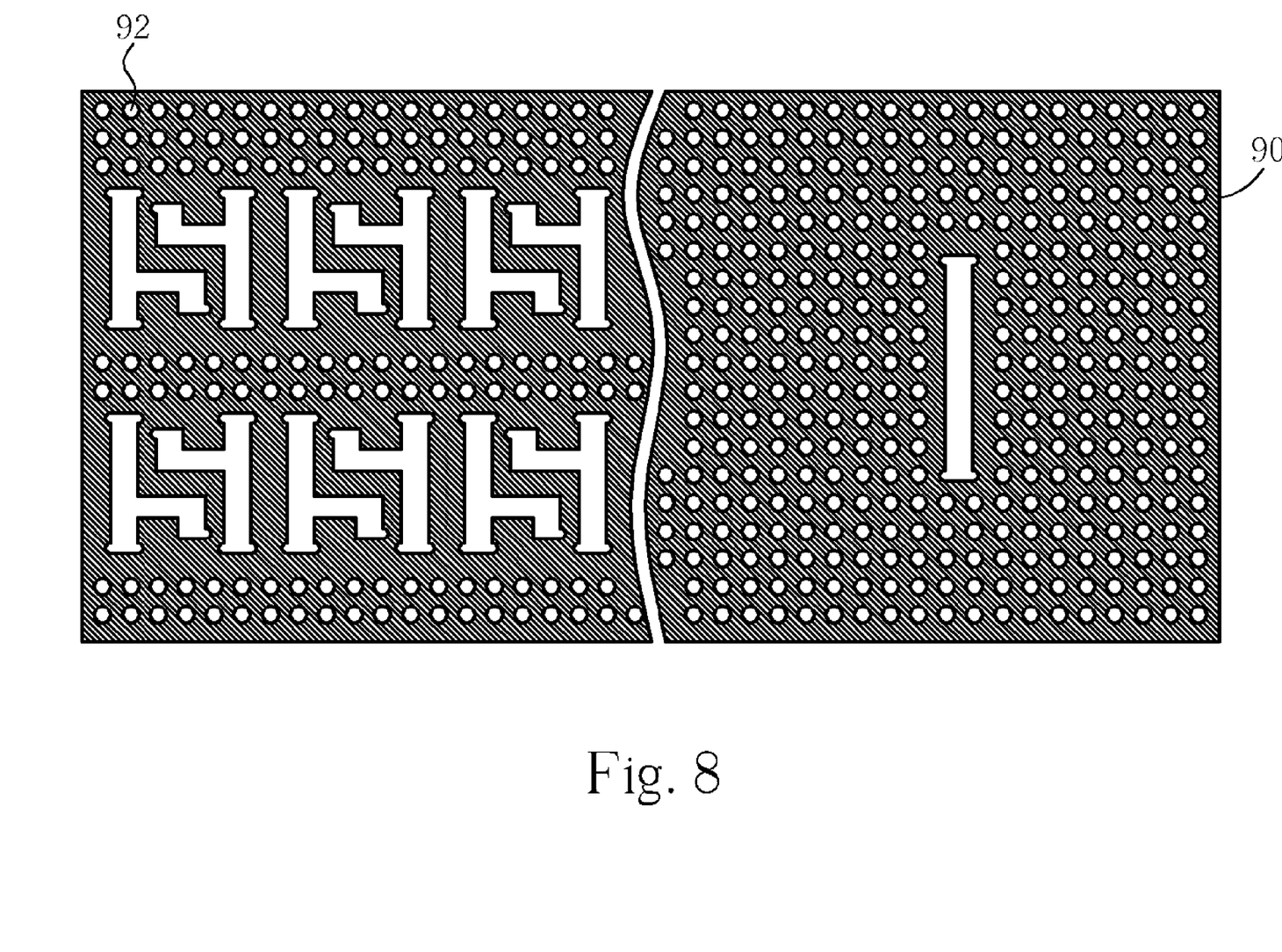
FIG. 8 is a schematic diagram illustrating a correction pattern in accordance with still another embodiment.

With reference to FIG. 8, FIG. 8 is a schematic diagram illustrating a correction pattern in accordance with still another embodiment. As shown in FIG. 8, the correction pattern 90 has a hole pattern 92. The hole pattern 92 allows light to pass, while the rest area does not. Accordingly, the light transmittance can be easily adjusted by tuning the density of the hole pattern 92. It is appreciated that the hole pattern 92 can be any shapes such as a small circle, triangle, rectangle, etc.

In addition, the optical proximity correction can be further modified by changing the gap between the primary mask and the assist mask (pellicle).

In conclusion, the OPC method of the present invention forms a reticle including a primary mask and an assist mask. In comparison with the primary mask, the assist mask is much cheaper. Therefore, as long as any parameter of the lithography process needs to be changed or the correction pattern needs to be modified to optimize the quality of lithography process, it is easy and cheap to form another assist mask instead of forming another primary mask. Thus, the OPC method is more flexible. The OPC method of the present invention is able to correct the proximity effect caused by micro-loading effect, photoresist acid diffusion effect, flare, etc. Also, It is to be appreciated that the assist mask can also be applied in a double exposure process. In such a case, the assist mask can be used as a secondary mask in another exposure process instead of combining with the primary mask in a single exposure process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reticle comprising:
   a primary mask having a primary pattern; and
   an assist mask having a correction pattern substantially complementary to the primary pattern, wherein the primary mask and the assist mask are overlapping in a vertical direction, and the primary pattern of the primary mask and the correction pattern of the assist mask are spaced in the vertical direction with a gap therebetween.

2. The reticle of claim 1, wherein a material of the correction pattern comprises a halftone material.

3. The reticle of claim 2, wherein the halftone material comprises molybdenum silicide.

4. The reticle of claim 2, wherein the correction pattern comprises a dot pattern or a hole pattern.

5. The reticle of claim 1, wherein the assist mask is a pellicle.

6. The reticle of claim 5, wherein a material of the correction pattern comprises a dye material.

7. The reticle of claim 1, wherein the assist mask is positioned below or above the primary mask.

8. An optical proximity correction (OPC) method comprising:
   providing a primary mask having a primary pattern;
   forming an assist mask having a correction pattern substantially complementary to the primary pattern; and
   forming a reticle by overlapping the primary mask and the assist mask, wherein the primary mask and the assist mask are overlapping in a vertical direction, and the primary pattern of the primary mask and the correction pattern of the assist mask are spaced in the vertical direction with a gap therebetween;
   wherein a light transmittance of the correction pattern is adjustable so as to equalize a light intensity distribution of the primary mask.

9. The OPC method of claim 8, wherein a material of the correction pattern comprises a halftone material.

10. The OPC method of claim 9, wherein the light transmittance of the correction pattern is adjusted by varying a thickness of the halftone material.

11. The OPC method of claim 9, wherein the halftone material comprises molybdenum silicide.

12. The OPC method of claim 8, wherein the correction pattern comprises a dot pattern or a hole pattern, and the light transmittance of the correction pattern is adjusted by tuning a density of the dot or the hole pattern.

13. The OPC method of claim 8, wherein a material of the correction pattern comprises a dye material, and the light transmittance of the correction pattern is adjusted by changing a concentration of the dye material.

14. The OPC method of claim 8, wherein the OPC is achieved by changing the gap between the primary mask and the assist mask.

15. The OPC method of claim 8, wherein the assist mask is a pellicle.

16. The OPC method of claim 8, wherein the correction pattern of the assist mask is obtained by a convolution process.

* * * * *